(12) United States Patent
Lee

(10) Patent No.: US 11,960,359 B2
(45) Date of Patent: Apr. 16, 2024

(54) MEMORY SYSTEM, MEMORY CONTROLLER AND OPERATING METHOD OF MEMORY SYSTEM

(71) Applicant: SK hynix Inc., Gyeonggi-do (KR)

(72) Inventor: Geu Rim Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/726,256

(22) Filed: Apr. 21, 2022

(65) Prior Publication Data
US 2023/0153200 A1   May 18, 2023

(30) Foreign Application Priority Data

Nov. 17, 2021 (KR) .................. 10-2021-0158401

(51) Int. Cl.
| | |
|---|---|
| G06F 11/00 | (2006.01) |
| G06F 11/07 | (2006.01) |
| G06F 11/10 | (2006.01) |
| G06F 11/30 | (2006.01) |
| G06F 12/02 | (2006.01) |
| G08C 25/00 | (2006.01) |
| H03M 13/00 | (2006.01) |
| H04L 1/00 | (2006.01) |

(52) U.S. Cl.
CPC ........ *G06F 11/1068* (2013.01); *G06F 11/076* (2013.01); *G06F 11/0772* (2013.01); *G06F 12/0246* (2013.01)

(58) Field of Classification Search
CPC ............... G06F 11/1068; G06F 11/076; G06F 11/0772; G06F 12/0246
See application file for complete search history.

(56) References Cited

U.S. PATENT DOCUMENTS

2018/0173432 A1\* 6/2018 Han .................. G06F 3/0658
2020/0201762 A1\* 6/2020 Bang ................. G06F 3/0619

FOREIGN PATENT DOCUMENTS

| KR | 10-2018-0076765 A | 7/2018 |
|---|---|---|
| KR | 10-2021-0003633 A | 1/2021 |
| KR | 10-2021-0018615 A | 2/2021 |

\* cited by examiner

*Primary Examiner* — Samir W Rizk
(74) *Attorney, Agent, or Firm* — IP & T GROUP LLP

(57) ABSTRACT

Embodiments of the present disclosure relate to a memory system, a memory controller and an operating method of the memory system. According to embodiments of the present disclosure, the memory system may receive, from an outside of the memory system, a read command, execute a defense code on the data when a failure occurs during an operation of reading data from the memory device in response to the read command, and transmit defense code information, which is information related to the execution of the defense code for data, to the outside of the memory system.

20 Claims, 14 Drawing Sheets

FIG.5
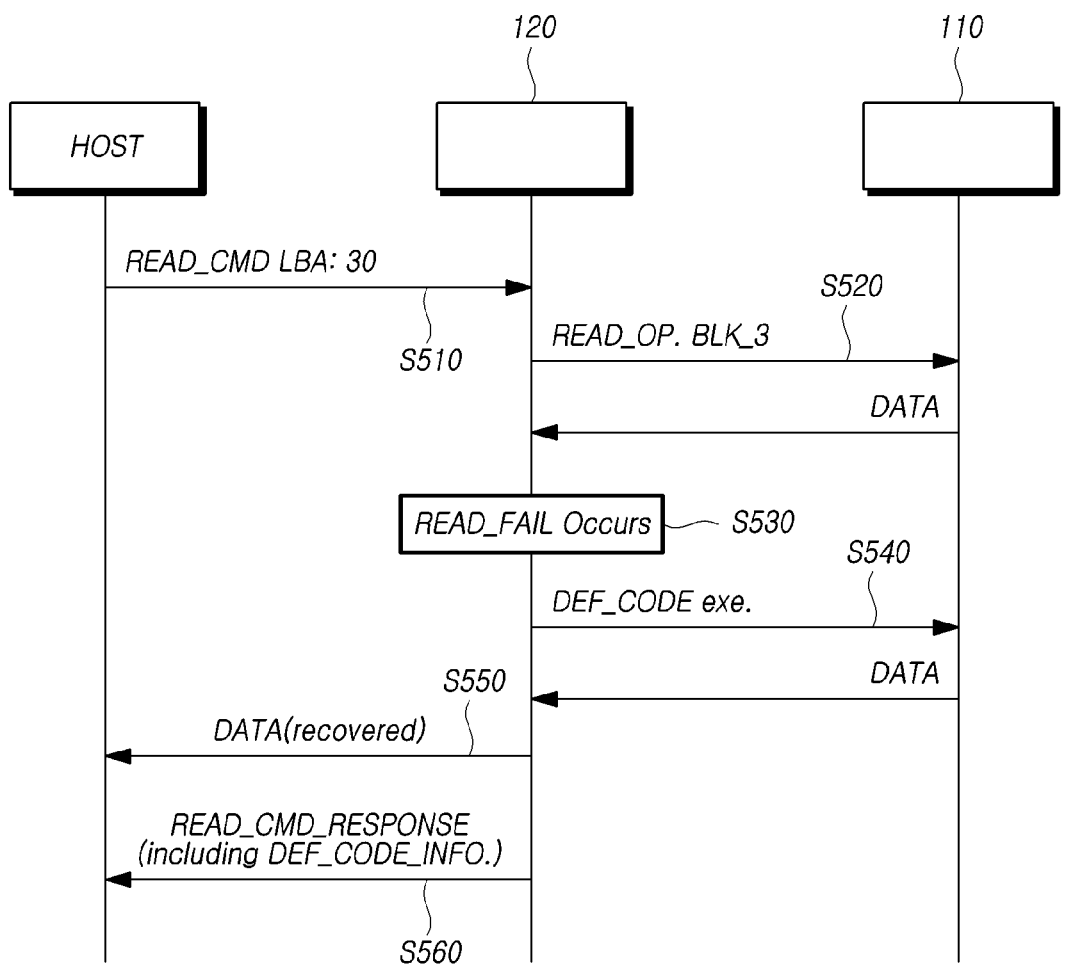
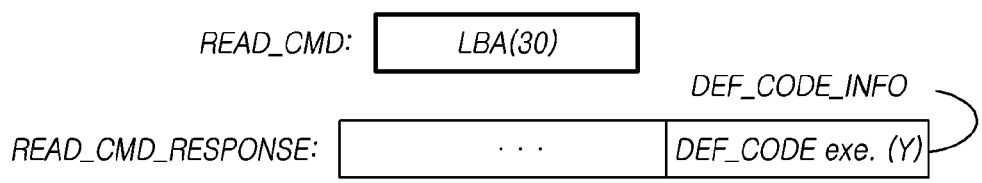

MEMORY SYSTEM, MEMORY CONTROLLER AND OPERATING METHOD OF MEMORY SYSTEM

CROSS-REFERENCE TO RELATED APPLICATION

The present application claims priority under 35 U.S.C. 119(a) to Korean patent application number 10-2021-0158401 filed on Nov. 17, 2021, which is incorporated herein by reference in its entirety.

TECHNICAL FIELD

The embodiments of the present disclosure relate to a memory system, a memory controller, and an operating method of the memory system.

BACKGROUND

A memory system includes a data storage device that stores data on the basis of a request from a host, such as a computer, servers, a smartphone, a tablet PC, or other electronic devices. Examples of a memory system span from a traditional magnetic-disk-based hard disk drive (HDD) to a semiconductor-based data storage device such as a solid state drive (SSD), a universal flash storage device (UFS), or an embedded MMC (eMMC) device.

The memory system may further include a memory controller for controlling the memory device. The memory controller may receive a command from the host and, on the basis of the received command, may execute the command or control read/write/erase operations on the memory devices in the memory system. The memory controller may be used to execute firmware operations for performing a logical operation for controlling such operations.

Moreover, if a failure occurs during an operation of reading data from a memory device, a memory system may execute a defense code for the corresponding data.

SUMMARY

Embodiments of the present disclosure may provide a memory system, a memory controller, and an operating method of the memory system capable of transmitting information about defense codes to the outside of the memory system to identify the status of data from the outside of the memory system.

In addition, embodiments of the present disclosure may provide a memory system, a memory controller, and an operating method of the memory system which guarantees data reliability by allowing a part or all of the data to be rewritten from the outside of the memory system according to the properties of the data.

In one aspect, embodiments of the present disclosure may provide a memory system including a memory device for storing data, and a memory controller configured to receive, from an outside of the memory system, a read command requesting to read the data, execute a defense code on the data when a failure occurs during an operation of reading the data from the memory device in response to the read command, and transmit defense code information, which is information related to an execution of the defense code for the data, to the outside of the memory system.

In another aspect, embodiments of the present disclosure may provide a memory controller including a first interface for communication with an outside of the memory controller, a second interface for communication with a memory device, and a control circuit configured to receive, through the first interface, a read command requesting to read data stored in the memory device, execute a defense code on the data when a failure occurs during an operation of reading the data from the memory device in response to the read command through the second interface, and transmit, through the first interface, defense code information, which is information related to an execution of the defense code for the data.

In another aspect, embodiments of the present disclosure may provide an operating method of a memory system including receiving, from an outside of the memory system, a read command requesting to read data stored in a memory device, executing a defense code on the data when a failure occurs during an operation of reading the data from the memory device in response to the read command, and transmitting defense code information, which is information related to an execution of the defense code for the data, to the outside of the memory system.

According to embodiments of the present disclosure, it is possible to check the status of data stored in the memory device from the outside of the memory system and guarantee the reliability of the stored data.

BRIEF DESCRIPTION OF THE DRAWINGS

FIG. 5 illustrates a response message transmitted by a memory controller of a memory system to a host according to embodiments of the present disclosure.

DETAILED DESCRIPTION

Figure 1:
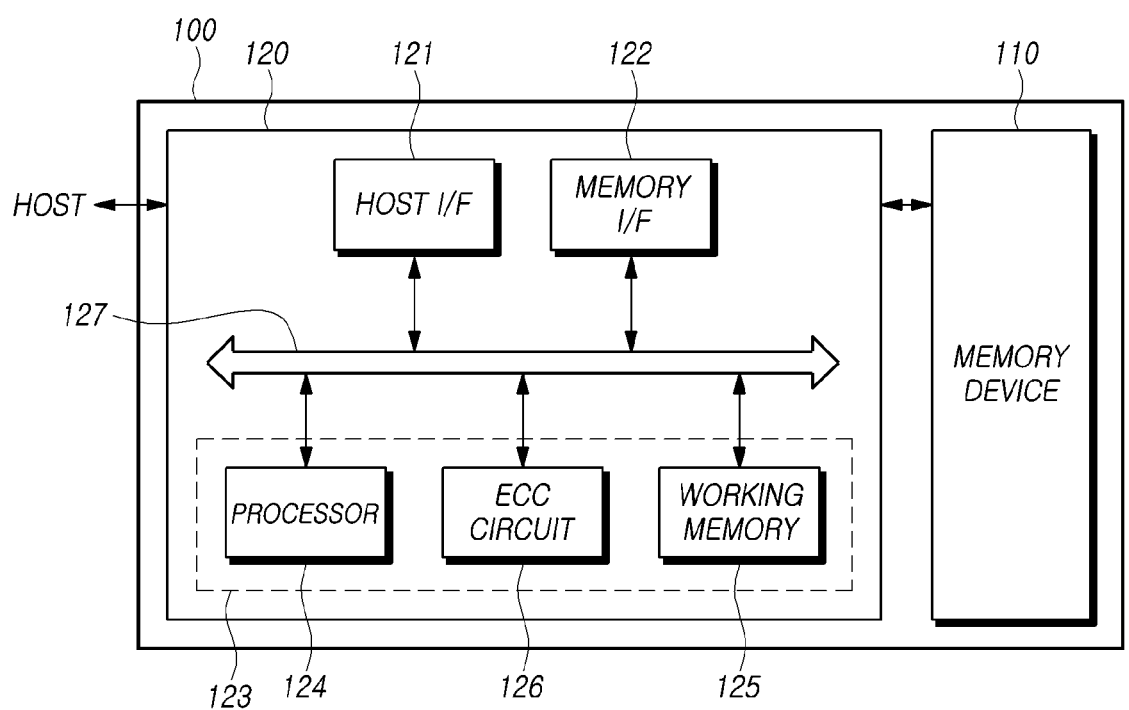
FIG. 1 is a schematic diagram illustrating a configuration of a memory system based on an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present disclosure are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout this disclosure, like reference numerals refer to like parts throughout the various figures and embodiments of the present disclosure.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory device having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host and to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. The processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In this disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check whether an error correction operation is needed on the next sector. Upon completion of the error detection and correction operations on all read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
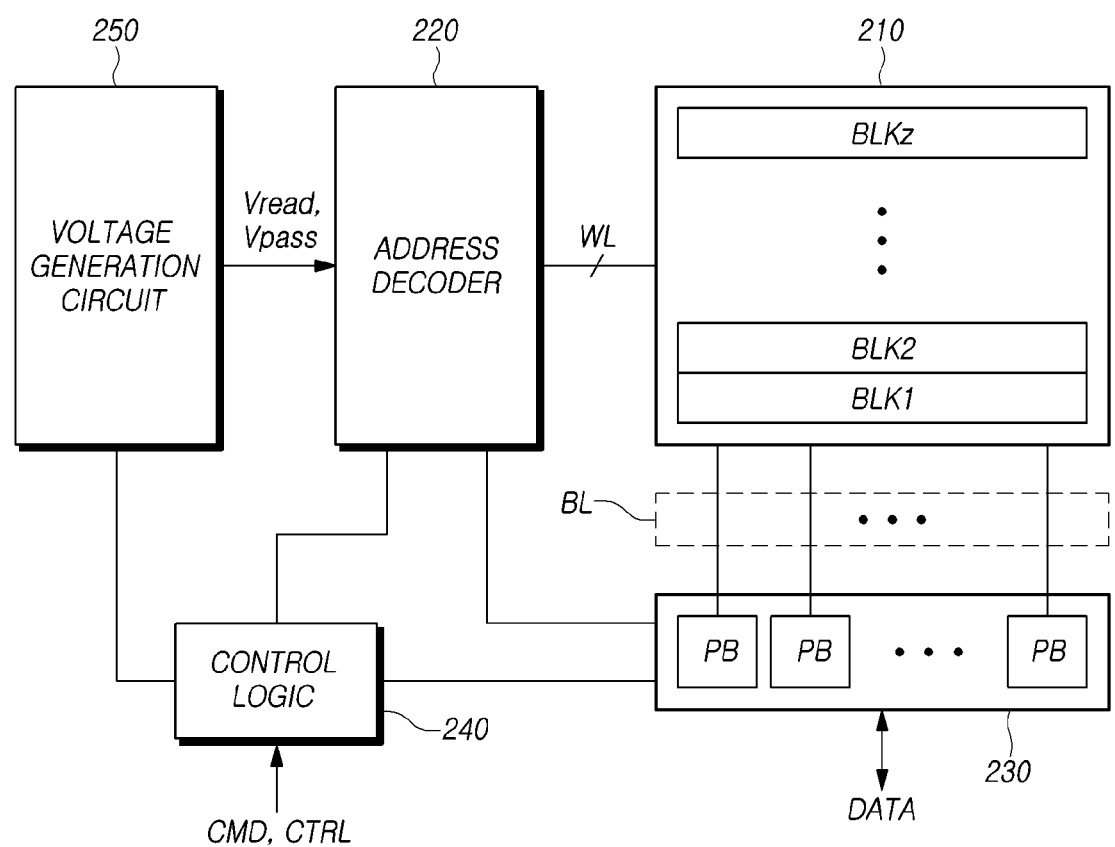
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
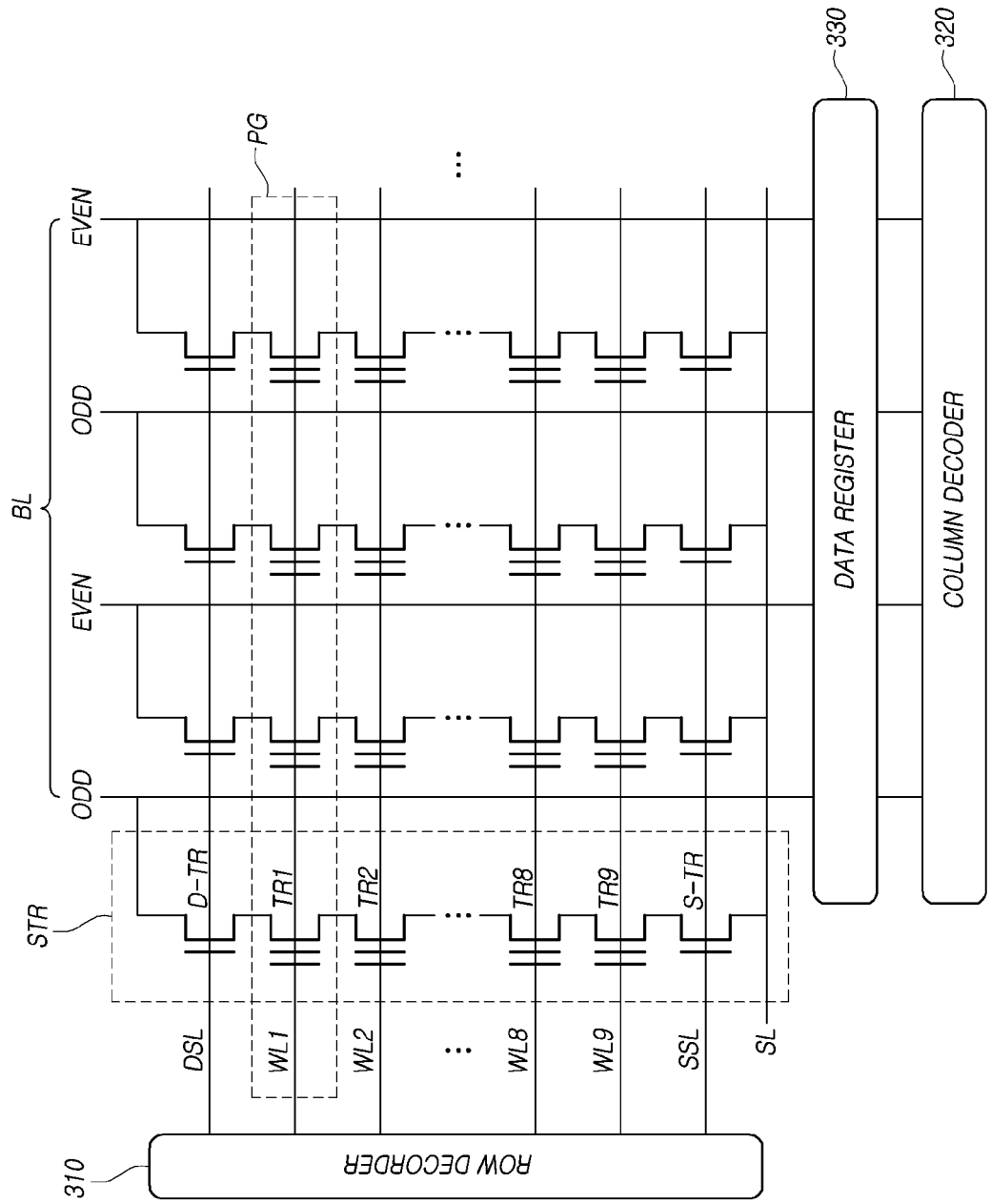
FIG. 3 illustrates a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of an odd-numbered bit line and an even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
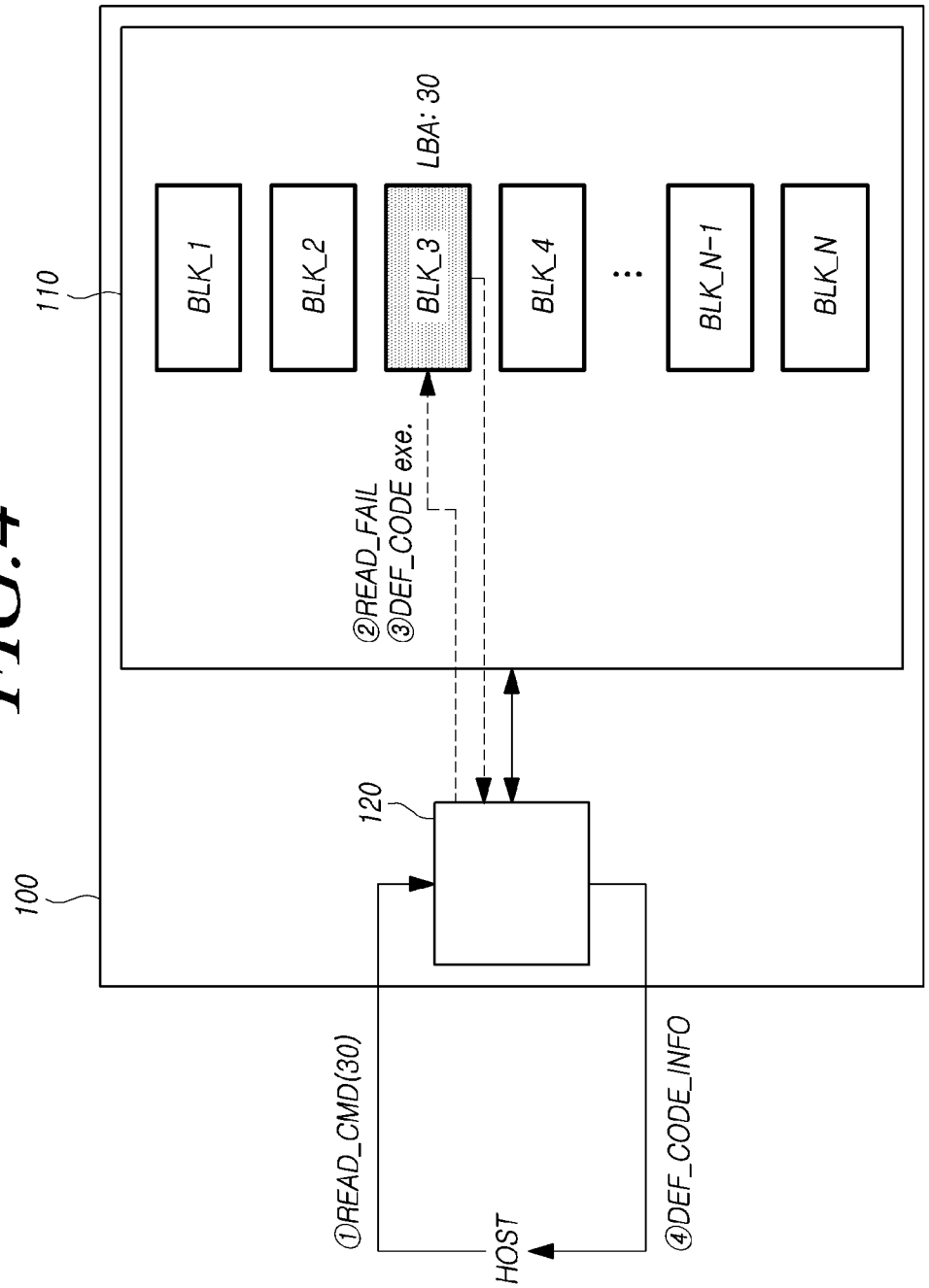
FIG. 4 illustrates a schematic operation of a memory system according to embodiments of the present disclosure.

FIG. 4 illustrates a schematic operation of a memory system 100 according to embodiments of the present disclosure.

Referring to FIG. 4, a memory controller 120 of the memory system 100 may receive a read command READ_CMD from the outside of the memory system 100 (①).

In this case, a host HOST may be an example of a device which transmits the read command READ_CMD from the outside of the memory system 100 to the memory controller 120. Hereinafter, for convenience of description, a device requesting an operation to the memory controller 120 from the outside of the memory system 100 is a host.

The read command READ_CMD is a command transmitted by the host HOST to the memory system 100 to request data to be read. The memory system 100 may transmit data stored in a memory device 110 in response to the read command READ_CMD received from the host HOST.

There may occur an error due to various reasons while the memory controller 120 reads data from the memory device 110. The memory controller 120 may detect the error occurred.

For example, the memory controller 120 may sequentially perform error detection and correction operations on data read from the memory device 110 through an error detection and correction circuit 126. The error detection and correction circuit 126 of the memory controller 120 may detect data determined to be uncorrectable. When determining that an error occurring during a read operation is uncorrectable, the memory controller 120 may determine that a fail READ_FAIL has occurred (②).

In this case, when a fail READ_FAIL occurs while reading data from the memory device 100 in response to the read command READ_CMD, the memory controller 120 may execute a defense code DEF_CODE exe for the data (③).

The defense code refers to an algorithm for recovering data whose error correction has finally failed through an error detection and correction circuit. The defense code may be executed in a variety of ways. As an example, the defense code may be executed through a method of changing a read voltage Vread in order to detect a change in the threshold voltage distribution formed in the memory cells included in the memory device 110.

Hereinafter, it will be described as an example a case in which the memory controller 120 receives the read command READ_CMD.

As described above, in FIG. 4, the memory controller 120 may receive the read command READ_CMD from the host HOST (①). The corresponding read command READ_CMD is a command for requesting data corresponding to a logical block address LBA 30.

The memory controller 120 may search for data corresponding to the logical block address LBA 30 in the memory device 110. For example, the memory controller 120 may read the corresponding data from the memory block BLK_3 in which data corresponding to the logical block address LBA 30 is stored, among a plurality of memory blocks BLK_1, BLK_2, BLK_3, BLK_4, ..., BLK_N−1, BLK_N included in the memory device 110.

If it is determined that a fail READ_FAIL has occurred in the process of reading the data (②), the memory controller 120 may execute a defense code DEF_CODE exe for the data (③).

Meanwhile, the memory system 100 may perform a read reclaim operation, which is an operation for moving the corresponding data to a location different from the previously stored location in order to secure the reliability of the data.

The memory system 100 may determine whether to execute a read reclaim operation on the corresponding data based on the degree of deterioration of the word line corresponding to the corresponding data on the memory device 110.

Even if the defense code is executed while the memory controller 120 reads the data from the memory device 110 for data with a low access frequency from the host HOST, a read reclaim operation may not be performed on the corresponding data. In this case, when the host HOST subsequently accesses the data, there may occur a problem in which data reliability cannot be guaranteed.

In addition, the host HOST needs to secure reliability with respect to data of high importance. However, generally, even if the memory controller 120 executes the defense code in the process of reading the corresponding data, the host HOST cannot confirm whether the memory controller 120 executes the defense code.

Accordingly, in embodiments of the present disclosure, the memory controller 120 receives the defense code information DEF_CODE_INFO, which is information related to the execution of the defense code for data read in response to the read command received from the host HOST, to the host (④).

The defense code information DEF_CODE_INFO is information about the defense code executed in response to a fail READ_FAIL occurring while the memory controller 120 reads data.

The defense code information DEF_CODE_INFO may indicate whether the defense code has been executed while the memory controller 120 reads data. The memory controller 120 transmits the defense code information DEF_CODE_INFO to the host HOST to notify whether the defense code has been executed while the read operation is being performed.

As shown in FIG. 4, since the memory controller 120 executed the defense code DEF_CODE exe in the process of reading data, the memory controller may transmit information DEF_CODE_INFO on the defense code executed by the host HOST (④).

The host HOST may refer to the defense code information DEF_CODE_INFO received from the memory controller 120 when determining the status of the data.

For example, the host HOST may transmit a read command READ_CMD to the memory system 100 to request to read data. Thereafter, the memory system 100 may perform a read operation in response thereto, and transmit the read data to the host HOST. In the case that the host HOST additionally receives the defense code information DEF_CODE_INFO from the memory controller 120, the host HOST may recognize that the memory controller 120 executed the defense code while reading the data. That the memory controller 120 executed the defense code in the process of reading the corresponding data may be understood as meaning that a fail READ_FAIL has occurred. Accordingly, the host HOST may determine that it is difficult to guarantee reliability of data received through the read command READ_CMD.

The host HOST may perform an operation to increase the reliability of the data based on the information of the data (e.g., the importance of the data, the access frequency) or the defense code information DEF_CODE_INFO received from the memory system 100.

For example, if the importance of data is greater than or equal to a set critical importance, and defense code information DEF_CODE_INFO for the data indicates that the reliability of the data is low, the host HOST may execute an operation for moving the corresponding data to a location different from a location previously stored in the memory device 110.

As another example, if the access frequency of data is less than or equal to the set threshold access frequency, and the defense code information DEF_CODE_INFO for the data indicates that the reliability of the data is low, the host may perform an operation for moving the corresponding data to a location different from a location previously stored in the memory device 110.

Moreover, the memory controller 120 may include a first interface for communication with a host HOST, a second interface for communication with the memory device 110, and a control circuit 123. The control circuit 123 may receive a read command READ_CMD requesting to read data stored in the memory device 110 from the host HOST through the first interface, execute a defense code on the data when a fail READ_FAIL occurs during an operation of reading data from the memory device 110 in response to the read command READ_CMD through the second interface, and transmit the defense code information DEF_CODE_INFO, which is information related to the execution of the defense code for the data, to the host HOST through the first interface.

In this case, the first interface may be a host interface 121 and the second interface may be a memory interface 122.

FIG. 5 illustrates a response message READ_CMD_RESPONSE transmitted by a memory controller 120 of a memory system 100 to a host HOST according to embodiments of the present disclosure.

Referring to FIG. 5, the memory controller 120 of the memory system 100 may transmit defense code information through a response message READ_CMD_RESPONSE corresponding to the read command READ_CMD.

The memory controller 120 may transmit the response message READ_CMD_RESPONSE in response to the read command READ_CMD.

Hereinafter, it will be described a case in which the memory controller 120 receives the read command READ_CMD from the host HOST as an example.

The memory controller 120 of FIG. 5 may receive a read command READ_CMD for a logical block address LBA 30 from the host (S510). The memory controller 120 may read data from a memory block BLK_3 of the memory device 110 in which data corresponding to the logical block address LBA 30 is stored (S520).

As shown in FIG. 5, in the case that an error correction operation for data read from the memory block BLK_3 fails, a fail READ_FAIL may occur (S530).

The memory controller 120 may execute the defense code DEF_CODE exe in response to the fail READ_FAIL (S540). The memory controller 120 may transmit data that has been successfully recovered through execution of the defense code to the host HOST (S550).

The memory controller 120 may transmit a response message READ_CMD_RESPONSE corresponding to the read command READ_CMD to the host.

In this case, the memory controller 120 may transmit the defense code information DEF_CODE_INFO to the host HOST by including the defense code information DEF_CODE_INFO in the response message READ_CMD_RESPONSE (S560).

Accordingly, the memory controller 120 may transmit whether a defense code is generated without using a separate report message to the host.

The host HOST may determine whether a fail READ_FAIL has occurred in the process of reading data corresponding to the read command READ_CMD and whether the defense code DEF_CODE exe is executed through the response message READ_CMD_RESPONSE received from the memory controller 120.

Figure 6:
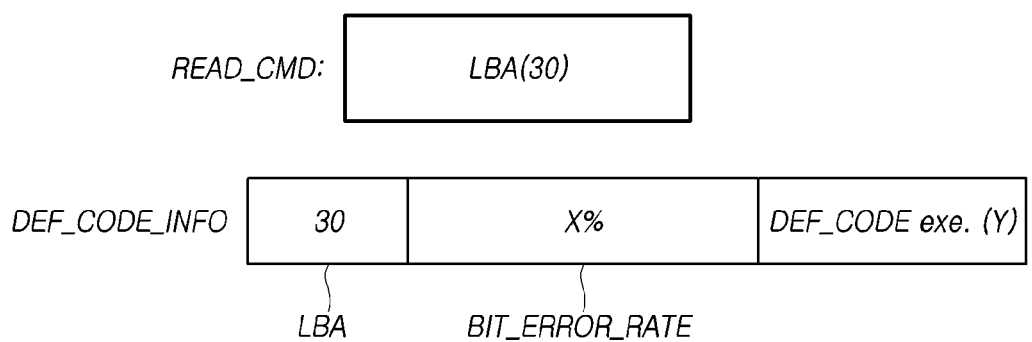
FIG. 6 illustrates an example of defense code information according to embodiments of the present disclosure.

FIG. 6 illustrates an example of defense code information DEF_CODE_INFO according to embodiments of the present disclosure.

Referring to FIG. 6, the defense code information DEF_CODE_INFO may include a logical block address LBA corresponding to data and information on a bit error rate of the data as a result of an operation of reading the data.

In the process of reading data from the memory device 110, the memory controller 120 may obtain the bit error rate of the data as a result of the data reading operation. For example, if an error occurs in B bits during an operation of reading data of A bits, the bit error rate may be determined as B/A, where A and B are natural numbers.

The memory controller 120 may determine whether an error occurring during a data reading operation is correctable based on the bit error rate of the data. For example, the memory controller 120 may determine that data having a bit error rate higher than a reference value cannot be corrected.

The memory controller 120 may transmit defense code information DEF_CODE_INFO including the bit error rate BIT_ERROR_RATE to the host HOST. Accordingly, the host HOST may determine the status of the data based on the bit error rate BIT_ERROR_RATE.

In addition, the memory controller 120 may transmit the defense code information DEF_CODE_INFO including the logical block address LBA corresponding to the data on which the defense code is executed.

As shown in FIG. 6, the defense code information DEF_CODE_INFO indicates a logical block address LBA of 30 and a bit error rate BIT_ERROR_RATE X % corresponding to the read command READ_CMD.

As described above, the host HOST may determine the status of data based on the logical block address LBA and the bit error rate BIT_ERROR_RATE included in the defense code information DEF_CODE_INFO. For example, the host HOST may determine, as the bit error rate BIT- _ERROR_RATE of read data is higher, that it is difficult to guarantee reliability of the read data. The host may request the memory system 100 to perform an operation to increase data reliability based on information (e.g., importance, access frequency) of the corresponding data or a bit error rate BIT_ERROR_RATE.

Figure 7:
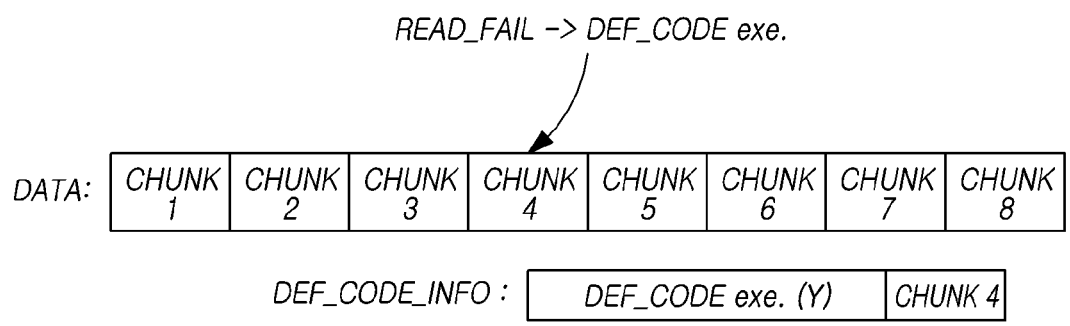
FIG. 7 illustrates an example of dividing and transmitting defense code information in chunk unit according to embodiments of the present disclosure.

FIG. 7 illustrates an example of dividing and transmitting defense code information in chunk unit according to embodiments of the present disclosure.

Referring to FIG. 7, the memory controller 120 of the memory system 100 may divide data into chunks CHUNK having a preset size, and may transmit defense code information DEF_CODE_INFO on a chunk in which the defense code is executed among the chunks CHUNK to the host HOST.

In FIG. 7, data may be divided into 8 chunks CHUNK 1, CHUNK 2, CHUNK3, CHUNK 4, CHUNK 5, CHUNK 6, CHUNK 7 and CHUNK 8.

The memory controller 120 may execute the defense code in units of chunks. The size of the chunk may be determined according to the structure of the memory device 110. For example, the size of the chunk may be set to 2 KB, 4 KB, or 8 KB.

As shown in FIG. 7, there may be confirmed that a fail READ_FAIL occurs in a chunk CHUNK 4 among the plurality of chunks.

The memory controller 120 may execute a defense code for the chunk CHUNK 4. The memory controller 120 may transmit defense code information DEF_CODE_INFO for the chunk CHUNK 4 in which the defense operation has occurred to the host HOST.

Through this, the host HOST may confirm whether the defense code is executed in units of chunks CHUNK.

Figure 8:
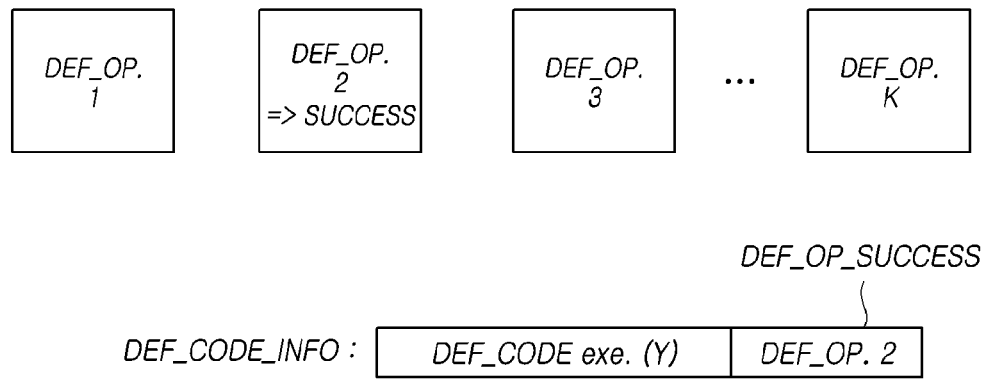
FIG. 8 illustrates an example of defense code information including information on a defense operation according to embodiments of the present disclosure.

FIG. 8 illustrates an example of defense code information DEF_CODE_INFO including information on a defense operation according to embodiments of the present disclosure.

Referring to FIG. 8, defense code information DEF_CODE_INFO may include information DEF_OP_SUCCESS regarding a defense operation used when data recovery for a fail occurring in the process of reading data is successful among one or more defense operations DEF_OP. 1, DEF_OP. 2, DEF_OP. 3, . . . , DEF_OP. K.

When the memory controller 120 executes the defense code for data, there may be performed one or more accompanying defense operations DEF_OP. 1, DEF_OP. 2, DEF_OP. 3, . . . , DEF_OP. K.

In FIG. 8, the memory controller 120 may confirm that the defense operation used when data recovery is successful is a defense operation DEF_OP. 2.

The information DEF_OP_SUCCESS on the defense operation used data recovery is successful included in the defense code information DEF_CODE_INFO may indicate the level of the defense operation that occurred while the memory controller 120 performs the read operation.

The host HOST may determine the reliability of the data based on the information DEF_OP_SUCCESS on the defense operation DEF_OP. 2 used when the data recovery is successful among the defense code information DEF_CODE_INFO received from the memory controller 120.

The host HOST may execute an operation to increase data reliability based on data information (e.g., importance, access frequency) or information DEF_OP_SUCCESS on a successful defense operation in data recovery.

Figure 9:
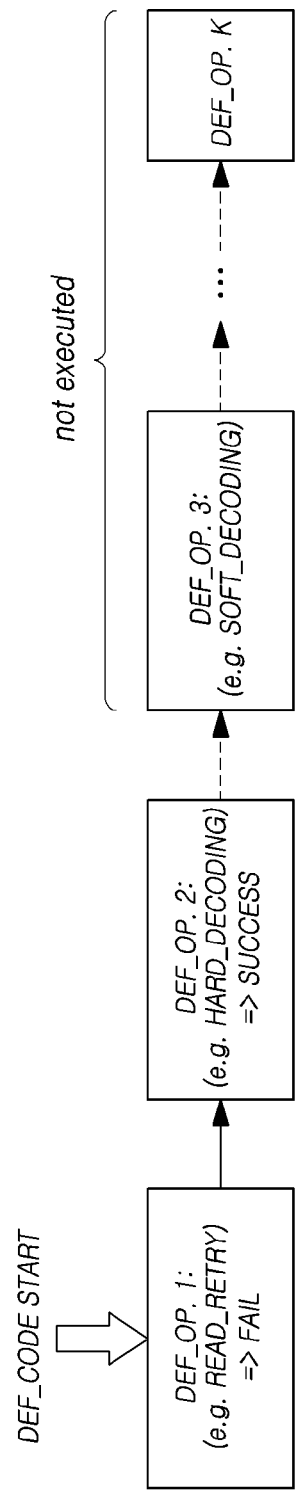
FIG. 9 illustrates an operation of sequentially performing a defense operation by a memory controller of a memory system according to embodiments of the present disclosure.

FIG. 9 illustrates an operation of sequentially performing a defense operation by a memory controller 120 of a memory system 100 according to embodiments of the present disclosure.

Referring to FIG. 9, when executing the defense code, the memory controller 120 of the memory system 100 may sequentially perform a plurality of defense operations DEF_OP according to a set order.

An individual defense operation may have different data recovery capability and time complexity required for data recovery depending on the operation algorithm.

As an example, the defense operation DEF_OP of FIG. 9 has a low data recovery capability, but may be a defense operation with low time complexity for data recovery.

If data recovery through the defense operation DEF_OP. 1 fails, the memory controller 120 may sequentially perform a defense operation DEP_OP. 2.

The defense operation DEP_OP. 2 has a relatively high data recovery capability compared to the defense operation 1, but may be an operation having relatively high time complexity for data recovery compared to the defense operation 1.

If data recovery through the defense operation DEF OP. 2 fails, the memory controller 120 may sequentially perform a defense operation DEP_OP. 3.

As shown in FIG. 9, the memory controller 120 performs up to a defense operation DEP_OP. K (K is a natural number equal to or greater than 2) according to a preset order in the above manner in order to recover data for a fail occurring in process of reading data.

If data recovery fails even after the defense operation DEP_OP. K is performed, the memory controller 120 may determine that it is impossible to recover data for a fail occurring during data read.

The memory controller 120 may efficiently operate the defense code by sequentially performing a plurality of defense operations. That is, the memory controller 120 can reduce the time required for data recovery by using a defense operation having low time complexity for data recovery, and the memory controller 120 can increase the possibility of data recovery by using a defense operation having high data recover capability for a fail which is difficult to be recovered.

Meanwhile, the plurality of defense operations may be variously set according to the defense code execution policy of the memory controller 120.

As shown in FIG. 9, when the execution of the defense code is started (DEF_CODE START), the memory controller 120 may first perform the defense operation DEF_OP. 1. As a result, the defense operation DEF_OP. 1 may fail data recovery.

Accordingly, the memory controller 120 may sequentially perform a defense operation DEF_OP. 2. In this case, the defense operation DEF_OP. 2 succeeded in data recovery.

If data recovery has been successful through the defense operation DEF_OP. 2, the memory controller 120 may stop additionally executing the defense code and transmit information on the successful defense operation DEF_OP. 2 to the host HOST by including it in the defense code information DEF_CODE_INFO. Since the data recovery has been successful by the defense operation DEF_OP. 2, the remaining defense operations DEF_OP. 3, . . . DEF_OP. K are not executed.

Moreover, the plurality of defense operations may include one or more of a read retry READ_RETRY, a hard decoding HARD_DECODING, and a soft decoding SOFT_DECODING.

The read retry READ_RETRY is one of the defense methods used for the memory controller 120 to recover data for fail occurring while reading data from the memory device 110, and may be a method of detecting a read voltage that succeeds in a read while changing the read voltage Vread when a fail occurs.

When performing the read retry READ_RETRY, the memory controller 120 may refer to a read retry table.

The read retry table is a table defining a plurality of read voltage levels. When performing the read retry READ_RETRY, the memory controller 120 may sequentially apply voltage levels defined in the read retry table.

The hard decoding HARD_DECODING is a decoding method of data recovery using only hard information (0 or 1) read using a single set of reference voltages. The hard decoding HARD_DECODING has a lower data recovery capability than soft decoding, which will be described later, but requires relatively low time complexity for data recovery.

The soft decoding SOFT_DECODING is a decoding method of data recovery by using soft information (probability that a corresponding cell contains 0 or 1) read using a plurality of reference voltages. Since the soft decoding SOFT_DECODING utilizes a plurality of reference voltages, an additional read operation may be required. The soft decoding SOFT_DECODING has a higher data recovery capability than hard decoding HARD_DECODING, but requires relatively high time complexity for data recovery.

In FIG. 9, as an example, the defense operation DEF_OP. 1 may be set to the read retry READ_RETRY, the defense operation DEF_OP. 2 may be set to the hard decoding HARD_DECODING, and the defense operation DEF_OP. 3 may be set to the soft decoding SOFT_DECODING.

If the order of defense operations is determined in the order in which the time required for data recovery is small, a low-level fail data may be preferentially recovered in a short time, thereby enabling efficient defense code execution.

Figure 10:
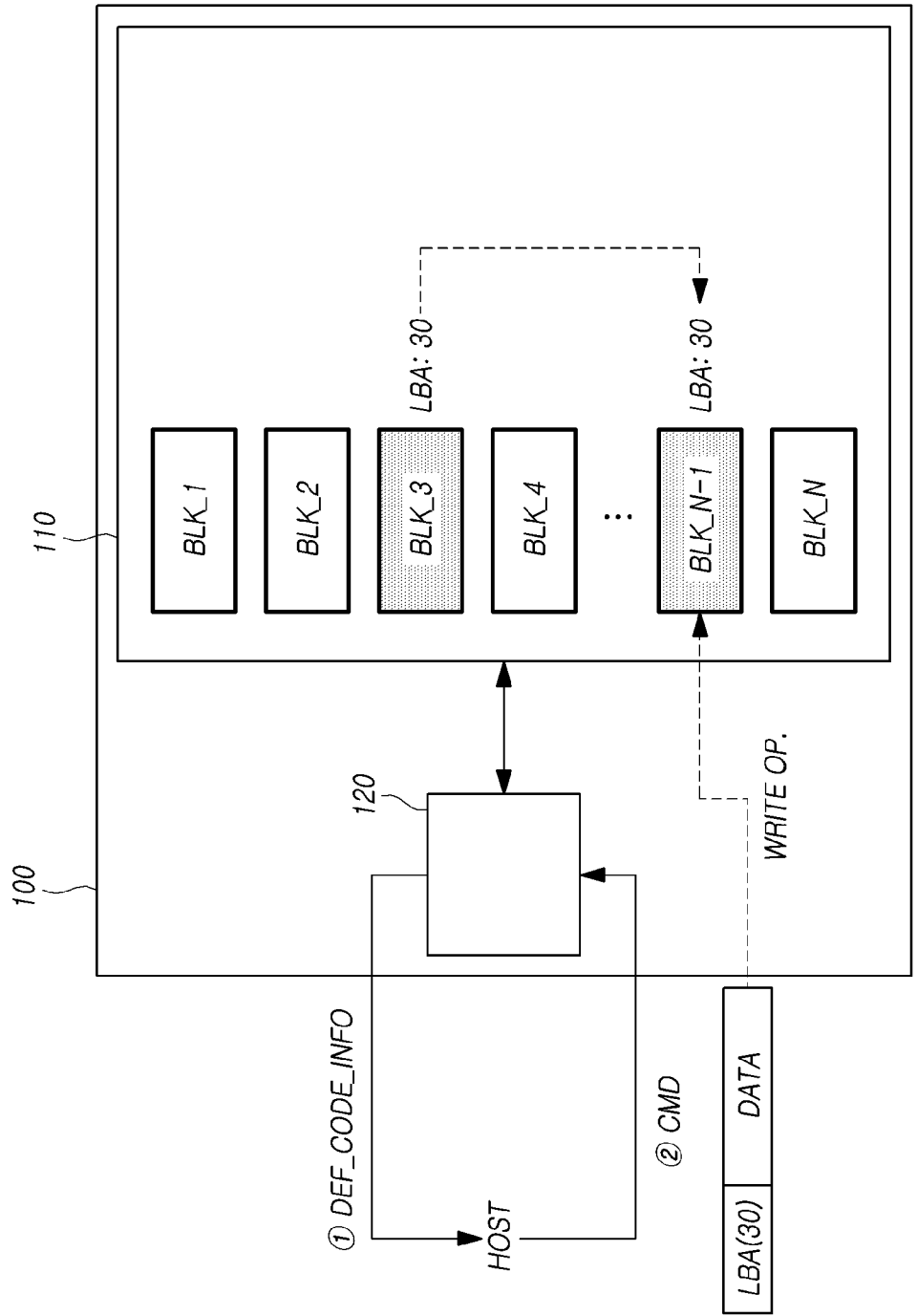
FIG. 10 illustrates an example of a write operation performed by a memory controller of a memory system according to embodiments of the present disclosure.

FIG. 10 illustrates an example of a write operation performed by a memory controller 120 of a memory system 100 according to embodiments of the present disclosure.

Referring to FIG. 10, the memory controller 120 of the memory system 100 may receive a command CMD requesting to rewrite a part or all of data DATA read from the host HOST through a read command.

If the host HOST receives the defense code information DEF_CODE_INFO from the memory controller 120 (①), the host HOST may determine that it is required an operation to secure the reliability of the data based on data information (e.g., importance, access frequency) or defense code information DEF_CODE_INFO. In this case, the host HOST may transmit a command CMD requesting to rewrite a part or all of the data DATA to the memory controller 120 (②).

The command CMD requesting to rewrite a part or all of the data DATA may be delivered in the form of a write command WRITE COMMAND, but is not limited thereto, and may also be delivered in the form of another command.

The memory controller 120 may write a part or all of the data DATA to the memory device 110 in response to the command CMD requesting to rewrite part or all of the data DATA. The data DATA previously stored in memory device 110 may be invalidated.

In this case, a location where a part or all of the data DATA is rewritten in the memory device 110 may be a location different from a location where the data DATA is previously stored.

As an example, if a part or all of the data DATA has been previously stored in the memory block BLK_3, a location to which a part or all of the data DATA is rewritten by the command CMD requesting to rewrite a part or all of the data DATA may be a memory block different from the memory block BLK_3.

Referring to FIG. 10, the memory controller 120 may receive a command CMD requesting to rewrite a part or all of the data, and may control the memory device 110 so that a part or all of the data DATA is written to the memory block BLK_N-1 instead of the memory block BLK_3.

In this case, a logical block address LBA 30 may be mapped to a memory block BLK_N-1.

When the data on which the defense code is executed is subsequently accessed by the memory controller 120, it is difficult to guarantee reliability. In addition, the memory controller 120 may not be able to execute a read reclaim operation to ensure reliability of the corresponding data.

The host HOST writes a part or all of the data DATA to another location of the memory device 110 through a command CMD requesting to rewrite the part or all of the data, so that the reliability of the data DATA can be guaranteed.

Figure 11:
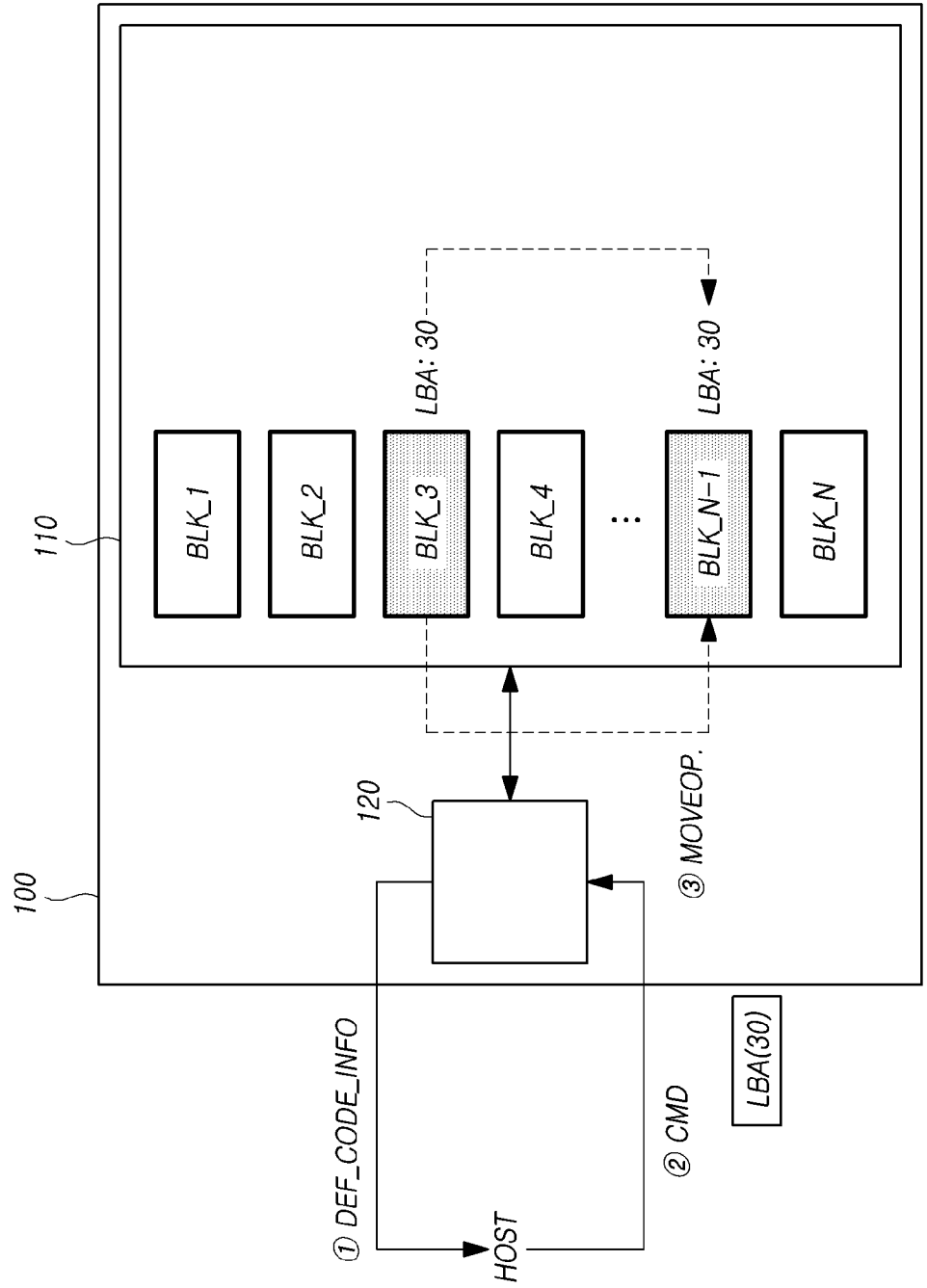
FIG. 11 illustrates another example of a write operation performed by a memory controller of a memory system according to embodiments of the present disclosure.

FIG. 11 illustrates another example of a write operation performed by a memory controller 120 of a memory system 100 according to embodiments of the present disclosure.

Referring to FIG. 11, a command CMD requesting to rewrite a part or all of the data may include a logical block address LBA 30 corresponding to the data. The command CMD may be a new type of command that transmits logical block address except data DATA different from a write command. The command CMD may be a customized vendor command In this case, the memory controller 120 may control the memory device 110 to move a part or all of the data stored in a location corresponding to the logical block address LBA 30 on the memory device 110 to another location of the memory device 110. For example, in the case that the location corresponding to the logical block address LBA 30 is the memory block BLK_3, the memory controller 120 may move a part or all of the data stored in the memory block BLK_3 to the memory block BLK_N-1.

The memory controller 120 may refer to the logical block address LBA included in the command CMD requesting to rewrite a part or all of the data received from the host HOST. In the memory device 110, data requested by the host HOST is stored in a location corresponding to the corresponding logical block address LBA.

The memory controller 120 may move a part or all of the data corresponding to the logical block address in the memory system 100 to another memory block in response to the command CMD received from the host (MOVE OP.; ③).

In FIG. 11, the memory controller 120 may receive a command CMD requesting to rewrite a part or all of the data indicating the logical block address LBA 30 from the host HOST (②). The memory controller 120 may move a part or all of the data stored in the location corresponding to the logical block address LBA 30 (e.g., the memory block BLK_3) to another location (e.g., the memory block BLK_N-1).

Accordingly, the memory controller 120 may reduce overhead required when performing an operation for ensuring reliability of data stored in the memory device 110 only with a logical block address LBA corresponding to the data without receiving data from the host HOST.

Figure 12:
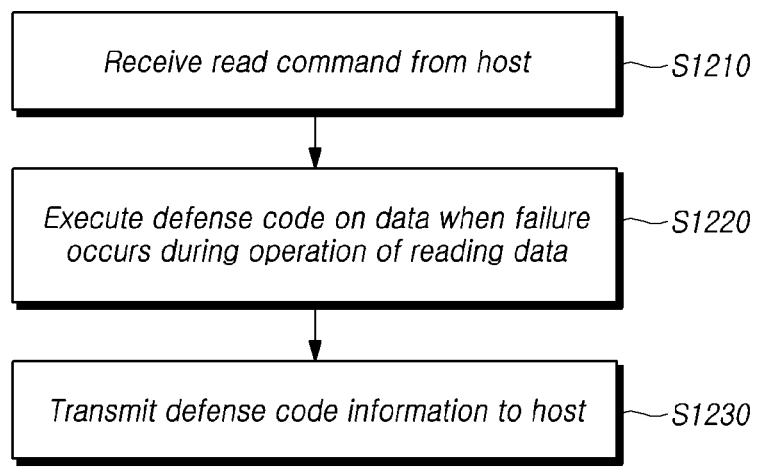
FIG. 12 illustrates an operating method of a memory system according to embodiments of the present disclosure.

FIG. 12 illustrates an operating method of a memory system 100 according to embodiments of the present disclosure.

Referring to FIG. 12, the operating method of the memory system 100 may include receiving a read command READ_CMD requesting to read data stored in the memory device 110 from the host HOST (S1210).

In addition, the operating method of the memory system 100 may include executing a defense code on the data when a failure occurs during an operation of reading data from the memory device 110 in response to the read command READ_CMD (S1220).

In addition, the operating method of the memory system 100 may include transmitting defense code information DEF_CODE_INFO, which is information related to execution of a defense code for data, to the host HOST (S1230).

Furthermore, in the operation S1230 of transmitting defense code information DEF_CODE_INFO to the host HOST, the defense code information may be transmitted through a response message READ_CMD_RESPONSE corresponding to the read command READ_CMD.

The defense code information DEF_CODE_INFO may include information on a logical block address LBA corresponding to data and a bit error rate BIT_ERROR_RATE of data as a result of an operation of reading the data.

In the operation S1230 of transmitting the defense code information DEF_CODE_INFO to the host, the data may be divided into chunks CHUNK, each chunk having a preset size, and a defense code information on the chunk in which the defense code is executed may be transmitted to the host HOST.

In the operation S1220 of executing the defense code, one or more defense operations may be performed.

In this case, the operation S1230 of transmitting the defense code information to the host may include transmitting information on the defense operation used when data recovery is successful.

The operation S1220 of executing the defense code may include sequentially performing a plurality of defense operations in a set order.

In this case, the plurality of defense operations may include one or more of read retry, hard decoding, or soft decoding.

Figure 13:
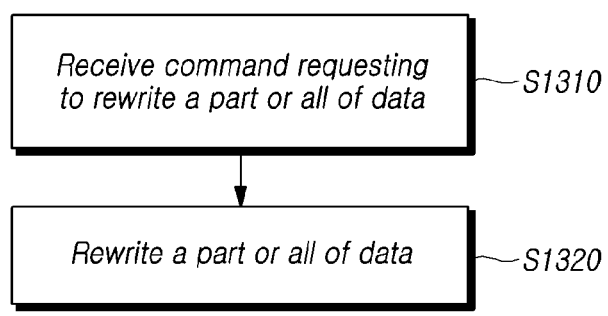
FIG. 13 illustrates an operating method for an operation of rewriting data by a memory system according to embodiments of the present disclosure.

FIG. 13 illustrates an operating method for an operation of rewriting data by a memory system 100 according to embodiments of the present disclosure.

Referring to FIG. 13, in the operating method of the memory system 100 may include receiving a command CMD requesting to rewrite a part or all of the data read through the read command READ_CMD from the host HOST (S1310).

In addition, the operating method of the memory system 100 may include rewriting the part or all of the data in the memory device 110 in response to the command CMD requesting to rewrite the part or all of the data (S1320).

In this case, the operation S1320 of rewriting the part or all of the data may include moving the part or all of the data to a location different from the previously stored location.

The operation of the memory controller 120 described above may be controlled by the control circuit 123 as described above, and the operation of the memory controller 120 may be performed in such a way that a processor 124 executes or runs the firmware in which various operations of the memory controller 120 are programmed.

Figure 14:
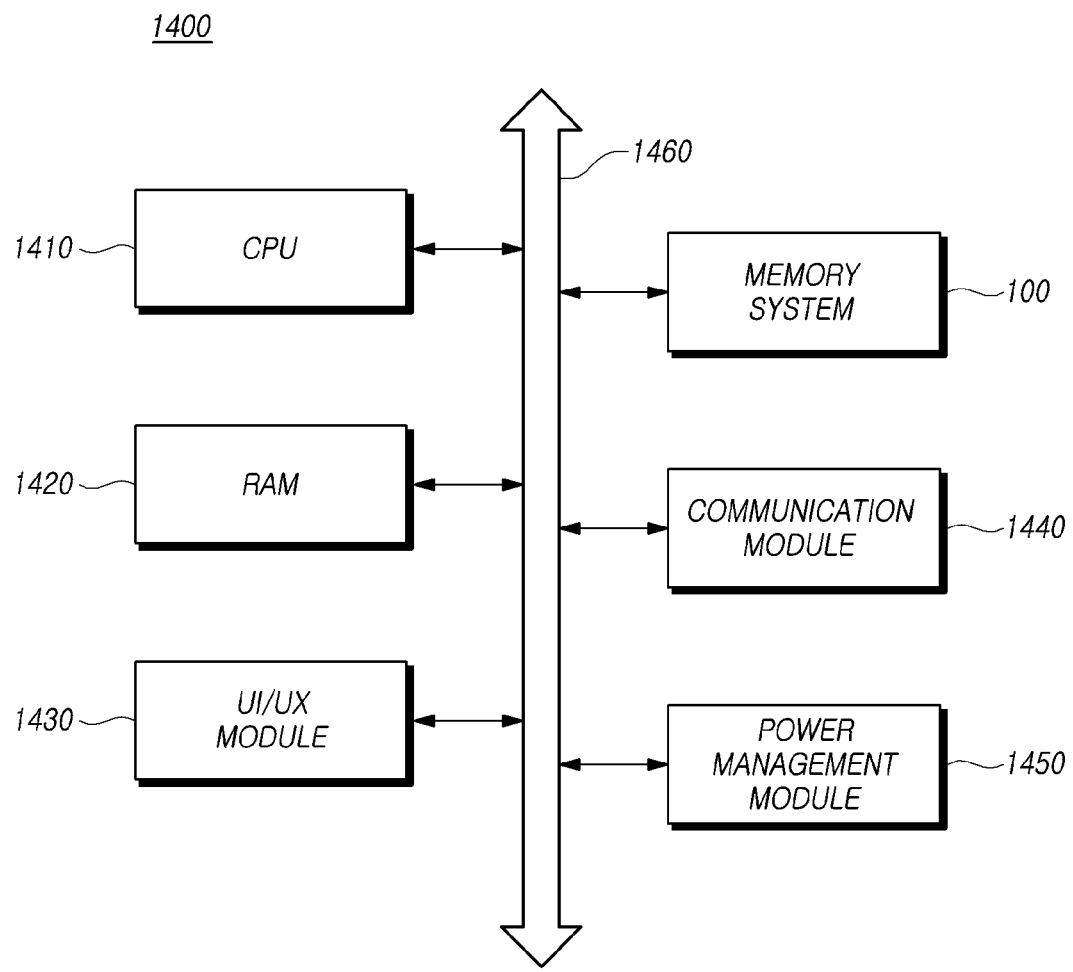
FIG. 14 illustrates the configuration of a computing system based on some embodiments of the disclosed technology.

FIG. 14 is a diagram illustrating the configuration of a computing system 1400 based on an embodiment of the disclosed technology.

Referring to FIG. 14, the computing system 1400 based on an embodiment of the disclosed technology may include: a memory system 100 electrically connected to a system bus 1460; a central processing unit (CPU) 1410 configured to control the overall operation of the computing system 1400; a random access memory (RAM) 1420 configured to store data and information related to operations of the computing system 1400; a user interface/user experience (UI/UX) module 1430 configured to provide the user with a user environment; a communication module 1440 configured to communicate with an external device as a wired and/or wireless type; and a power management module 1450 configured to manage power used by the computing system 1400.

The computing system 1400 may be a personal computer (PC) or may include a mobile terminal such as a smartphone, a tablet or various electronic devices.

The computing system 1400 may further include a battery for supplying an operating voltage, and may further include an application chipset, a graphic-related module, a camera image processor, and a dynamic random access memory (DRAM). Other elements that can be included would be apparent to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the present disclosure described above, the operation delay time of the memory system may be advantageously reduced or minimized. In addition, based on an embodiment of the present disclosure, an overhead occurring in the process of calling a specific function may be advantageously reduced or minimized. Although various embodiments of the present disclosure have been described with particular specifics and varying details for illustrative purposes, those skilled in the art will appreciate that various modifications, additions and substitutions may be made based on what is disclosed or illustrated in the present disclosure and the following claims. Furthermore, the embodiments may be combined to form additional embodiments.

What is claimed is:

1. A memory system comprising:
   a memory device for storing data; and
   a memory controller configured to:
   receive, from a host outside of the memory system, a read command requesting to read the data,
   execute a defense code on the data when a failure occurs during an operation of reading the data from the memory device in response to the read command, and
   transmit defense code information, which is information related to the execution of the defense code for the data, to the host outside of the memory system,
   wherein transmittal of the defense code information to the host indicates that the data read from the memory device was recovered by execution of the defense code.

2. The memory system of claim 1, wherein the memory controller transmits the defense code information through a response message corresponding to the read command.

3. The memory system of claim 1, wherein the defense code information comprises information on a logical block address corresponding to the data and a bit error rate of the data as a result of the operation of reading the data.

4. The memory system of claim 1,
wherein the data is divided into chunks each chunk having a preset size, and
wherein the memory controller transmits, to the outside of the memory system, defense code information on a chunk on which a defense code is executed, within the data.

5. The memory system of claim 1,
wherein the memory controller executes the defense code to perform one or more defense operations on the data, and
wherein the memory controller transmits, to the outside of the memory system, defense code information on a defense operation used when data recovery is successful among the defense operations.

6. The memory system of claim 5,
wherein the memory controller sequentially performs, when executing the defense code, the defense operations on the data according to a set order, and
wherein the defense operations comprise at least one of read retry, hard decoding, and soft decoding.

7. The memory system of claim 1, wherein the memory controller is further configured to:
receive, from the outside of the memory system, a command requesting to rewrite a part or all of the data read through the read command, and
rewrite the part or all of the data to the memory device in response to the command requesting to rewrite the part or all of the data.

8. The memory system of claim 7, wherein the memory controller rewrites the part or all of the data to the memory device by controlling the memory device to move the part or all of the data to a location different from a previously stored location.

9. A memory controller comprising:
a first interface for communication with a host outside of the memory controller;
a second interface for communication with a memory device; and
a control circuit configured to:
receive, through the first interface, a read command requesting to read data stored in the memory device,
execute a defense code on the data when a failure occurs during an operation of reading the data from the memory device in response to the read command through the second interface, and
transmit, through the first interface to the host, defense code information related to the execution of the defense code for the data,
wherein transmittal of the defense code information to the host indicates that the data read from the memory device was recovered by execution of the defense code.

10. The memory controller of claim 9, wherein the control circuit transmits the defense code information through a response message corresponding to the read command.

11. The memory controller of claim 9, wherein the defense code information comprises information on a logical block address corresponding to the data and a bit error rate of the data as a result of the operation of reading the data.

12. The memory controller of claim 9,
wherein the data is divided into chunks each chunk having a preset size, and
wherein the control circuit transmits, through the first interface, defense code information on a chunk on which a defense code is executed, within the data.

13. An operating method of a memory system comprising:
receiving, from a host outside of the memory system, a read command requesting to read data stored in a memory device;
executing a defense code on the data when a failure occurs during an operation of reading the data from the memory device in response to the read command; and
transmitting defense code information, which is information related to the execution of the defense code for the data, to the host outside of the memory system,
wherein transmittal of the defense code information to the host indicates that the data read from the memory device was recovered by execution of the defense code.

14. The operating method of claim 13, wherein the transmitting defense code information comprises transmitting the defense code information through a response message corresponding to the read command.

15. The operating method of claim 13, wherein the defense code information comprises information on a logical block address corresponding to the data and a bit error rate of the data as a result of the operation of reading the data.

16. The operating method of claim 13,
wherein the data is divided into chunks each chunk having a preset size, and
wherein the defense code information is on a chunk on which a defense code is executed, within the data.

17. The operating method of claim 13,
wherein the executing the defense code comprises performing one or more defense operations on the data, and
wherein the transmitting defense code information comprises transmitting, to the outside of the memory system, defense code information on a defense operation used when data recovery is successful among the defense operations.

18. The operating method of claim 17,
wherein the executing the defense code comprises sequentially performing the defense operations on the data according to a set order, and
wherein the defense operations comprise at least one of read retry, hard decoding, and soft decoding.

19. The operating method of claim 13, further comprising:
receiving, from the outside of the memory system, a command requesting to rewrite a part or all of the data read through the read command; and
rewriting the part or all of the data to the memory device in response to the command requesting to rewrite the part or all of the data.

20. The operating method of claim 19, wherein the rewriting the part or all of the data to the memory device comprises moving the part or all of the data to a location different from a previously stored location.

* * * * *